United States Patent
Hasegawa

(12) 
(10) Patent No.: US 6,341,363 B1
(45) Date of Patent: Jan. 22, 2002

(54) DELAY COMPUTATION APPARATUS, DELAY COMPUTATION METHOD, AND STORAGE MEDIUM FOR DETERMINING A PATH OF A LOGIC CIRCUIT WITH MAXIMUM OR MINIMUM DELAY TIMES

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/239,540

(22) Filed: Jan. 29, 1999

(30) Foreign Application Priority Data

Jan. 30, 1998 (JP) .......................................... 10-019914

(51) Int. Cl.[7] ............................................. G06F 17/50
(52) U.S. Cl. ................................................. 716/6; 716/7
(58) Field of Search .................................. 716/6, 7, 10

(56) References Cited

U.S. PATENT DOCUMENTS

| | | | | |
|---|---|---|---|---|
| 5,815,655 A | * | 9/1998 | Koshiyama | 714/45 |
| 5,828,870 A | * | 10/1998 | Gunadisastra | 713/503 |
| 5,838,581 A | * | 11/1998 | Kuroda | 716/8 |
| 5,859,776 A | * | 1/1999 | Sato et al. | 700/121 |
| 5,889,677 A | * | 3/1999 | Yasuda et al. | 716/6 |
| 5,960,309 A | * | 9/1999 | Takano | 438/622 |
| 6,023,767 A | * | 2/2000 | Kumar et al. | 713/400 |
| 6,080,206 A | * | 6/2000 | Tadokoro et al. | 716/10 |
| 6,090,150 A | * | 7/2000 | Tawad | 703/19 |

FOREIGN PATENT DOCUMENTS

JP 5-189511 7/1993

OTHER PUBLICATIONS

Seki et al, "A Practical Clock Router That Accounts for the Capacitance Derived from Parallel and Cross Segments," IEEE, 1996, pp. 362–367.*

Neves et al, "Design Methodology for Synthesizing Clock Distribution Networks Exploiting Nonzero Localized Clock Skew," IEEE, Jun. 1996, pp. 286–291.*

* cited by examiner

Primary Examiner—Matthew Smith
Assistant Examiner—Vuthe Siek
(74) Attorney, Agent, or Firm—Sughrue Mion, PLLC

(57) ABSTRACT

An apparatus of the present invention computes delay times of logic paths included in a logic circuit which has a plurality of elements whose output is determined by the input of a clock signal and at least one signal which is not the clock signal. The apparatus includes: a first element which stores information about the logic circuit; a second element which groups pairs of two elements into groups based on a clock skew range value between the elements in each of the pair groups; and a third element which computes a delay time for each of the groups grouped by the second element by using a predetermined clock skew value related to the range used in the second element and the information about the logic circuit stored in the first element.

30 Claims, 7 Drawing Sheets

○ : Node
→ : Arc

FIG. 5

| Arc identifiers | Input direction nodes | Output direction nodes | Arcs of the same input node | Arcs of the same output node | Delay times | Element delay times | Element names | Line names |
|---|---|---|---|---|---|---|---|---|
| Arc 5-1 | Node 4-1 | Node 4-2 | 0 | 0 | 1 | 1 | Register 11 | Line 31 |
| Arc 5-2 | Node 4-2 | Node 4-3 | 0 | 0 | 1 | 0 | Delay gate 21 | - |
| Arc 5-3 | Node 4-3 | Node 4-4 | Arc 5-6 | 0 | 1 | 0 | - | Line 32 |
| Arc 5-4 | Node 4-4 | Node 4-5 | 0 | 0 | 2 | 0 | Not gate 22 | - |
| Arc 5-5 | Node 4-5 | Node 4-6 | Arc 5-9 | 0 | 1 | 1 | Register 12 | Line 33 |
| Arc 5-6 | Node 4-3 | Node 4-7 | 0 | 0 | 1 | 0 | - | Line 32 |
| Arc 5-7 | Node 4-7 | Node 4-8 | 0 | 0 | 0.5 | 0 | - | - |
| Arc 5-8 | Node 4-8 | Node 4-9 | 0 | 0 | 0.5 | 0.5 | Delay gate 23 | Line 34 |
| Arc 5-9 | Node 4-3 | Node 4-10 | 0 | 0 | 1 | 0 | Register 13 | Line 32 |
| Arc 5-10 | Node 4-10 | Node 4-11 | 0 | 0 | 0.3 | 0 | Not gate 24 | - |
| Arc 5-11 | Node 4-11 | Node 4-12 | 0 | 0 | 0.3 | 0.5 | Register 14 | Line 35 |

FIG. 6

| Starting point / End point | Register 11 | Register 12 | Register 13 | Register 14 |
|---|---|---|---|---|
| Register 11 | 0 | 1 | 2 | 4 |
| Register 12 | 1 | 0 | 3 | 2 |
| Register 13 | 2 | 3 | 0 | 3 |
| Register 14 | 4 | 2 | 3 | 0 |

| Starting point / End point | Register 11 | Register 12 | Register 13 | Register 14 |
|---|---|---|---|---|
| Register 11 | 0 (Group G1) | 1 (Group G1) | 2 (Group G1) | 4 (Group G2) |
| Register 12 | 1 (Group G1) | 0 (Group G1) | 3 (Group G2) | 2 (Group G1) |
| Register 13 | 2 (Group G1) | 3 (Group G2) | 0 (Group G1) | 3 (Group G2) |
| Register 14 | 4 (Group G2) | 2 (Group G1) | 3 (Group G2) | 0 (Group G1) |

~231

DELAY COMPUTATION APPARATUS, DELAY COMPUTATION METHOD, AND STORAGE MEDIUM FOR DETERMINING A PATH OF A LOGIC CIRCUIT WITH MAXIMUM OR MINIMUM DELAY TIMES

BACKGROUND OF THE INVENTION

The present invention relates to a delay computation apparatus and delay computation method for a logic circuit, and a storage medium that stores a delay computation program. More particularly, the invention relates to a delay computation apparatus, delay computation method and a storage medium that stores a delay computation program for determining a path of a logic circuit with maximum or minimum delay times.

A conventional delay computation apparatus or method of this type collectively traces, by a depth first search (hereinafter referred to as a CFS), each of a plurality of logic paths beginning with a single starting point. More specifically, the conventional apparatus or method computes a critical path by using the delay times of elements and wiring included in a logic circuit, and by collectively tracing all end points of a plurality of logic paths as a trace object. However, in this conventional delay computation apparatus or method, a true critical path is not necessarily obtained because there are factors which make the conventional apparatus or method unable to compute the actual delay times of logic paths. Such factors include, for example, clock skew.

An example of the conventional delay computation apparatus is described in Japanese Patent Application Laid-Open No. 5-189511. In a logic circuit consisting of mutually different logic devices, e.g., where the sender flip-flop (FF) and the receiver FF in the logic path differ in logic, the conventional apparatus described in the aforementioned publication computes delay time by referring to a clock skew value in a clock skew value table which is based on a combination of these different logic devices.

While this conventional delay computation apparatus can compute a critical path based on the clock skew between different logic circuits, the conventional apparatus cannot compute a critical path when the clock skews between registers differ within the same logic.

For instance, in a logic path including a first register and a second register, if a delay time of a path leading from the first register to the second register is merely computed, the true delay time will not be necessarily computed. This is because when clock skew has occurred between a clock signal supplied to the first register and a clock signal supplied to the second register, the true delay time will change because of the clock skew. In most cases, if there are a plurality of registers, clock skew between registers will occur because the clock paths for supplying clock signals to the registers also differ from each other.

SUMMARY OF THE INVENTION

Accordingly, an object of the present invention is to provide a delay computation apparatus which accurately computes the critical path of a plurality of logic paths.

Another object of the present invention is to provde a delay computation apparatus which computes the true delay time of a logic path when clock skew occurs between registers included in the logic path.

According to one aspect of the present invention, an apparatus for computing delay times of logic paths included in a logic circuit, which has a plurality of elements whose output is determined by the input of a clock signal and at least one signal which is not the clock signal, is provided which comprises: a first element which stores information about the logic circuit; a second element which groups pairs of elements into groups based on the clock skew value of the pairs of the elements, wherein each group has a specific range of clock skew values; and a third element which computes a delay time for each of the pairs of elements grouped by the second element by using a predetermined clock skew value, which is within the range used in the second element, and the information about the logic circuit stored in the first element.

According to another aspect of the present invention, an apparatus for computing delay times of logic paths included in a logic circuit which has a plurality of elements whose output is determined by the input of a clock signal and at least one signal which is not the clock signal, is provided which comprises: first storage means for storing information about the logic circuit; means for grouping the pairs of the elements into groups based on the clock skew value of the pairs of the elements, wherein each group has a specific range of clock skew values; and means for computing the delay time for each of the pairs of the elements grouped by the grouping means by using the predetermined clock skew value, which is within the range used in the grouping means, and the information about the logic circuit stored in the first storage means.

According to another aspect of the present invention, a method for computing delay times of logic paths included in a logic circuit which has a plurality of elements whose output is determined by the input of a clock signal and at least one signal which is not the clock signal, is provided which comprises: storing information about the logic circuit in a first storing element; grouping the pairs of the elements into groups based on the clock skew value of the pairs of the elements, wherein each group has a specific range of clock skew values; and computing a delay time for (each of the pairs grouped during the grouping step by using a predetermined clock skew value, which is within the range used during the grouping step, and the information about the logic circuit stored in the first storage element.

According to another aspect of the present invention, a computer-usable storage medium has a computer program which causes a computer to perform the following steps: store information about the logic circuit in a first storing element; group pairs of the elements into groups based on the clock skew value of the pairs of the elements, wherein each group has a specific range of clock skew values; and compute the delay time for each of the pairs grouped during the grouping step, by using a predetermined clock skew value, which is within the range used during the grouping step, and the information about the logic circuit stored in the first storage element.

BRIEF DESCRIPTION OF THE DRAWINGS

Other features and advantages of the invention will be made more apparent by the following detailed description and the accompanying drawings, wherein:

FIG. 5 is a diagram showing arc table 212 of the present invention;

FIG. 6 is a diagram showing skew value table 221 of the present invention;

FIG. 7 is a diagram showing register group table 231 of the present invention;

In the drawings, the same reference numerals represent the same structural elements.

DETAILED DESCRIPTION OF THE PREFERRED EMBODIMENTS

A first embodiment of the present invention will be described in detail below.

Figure 1:
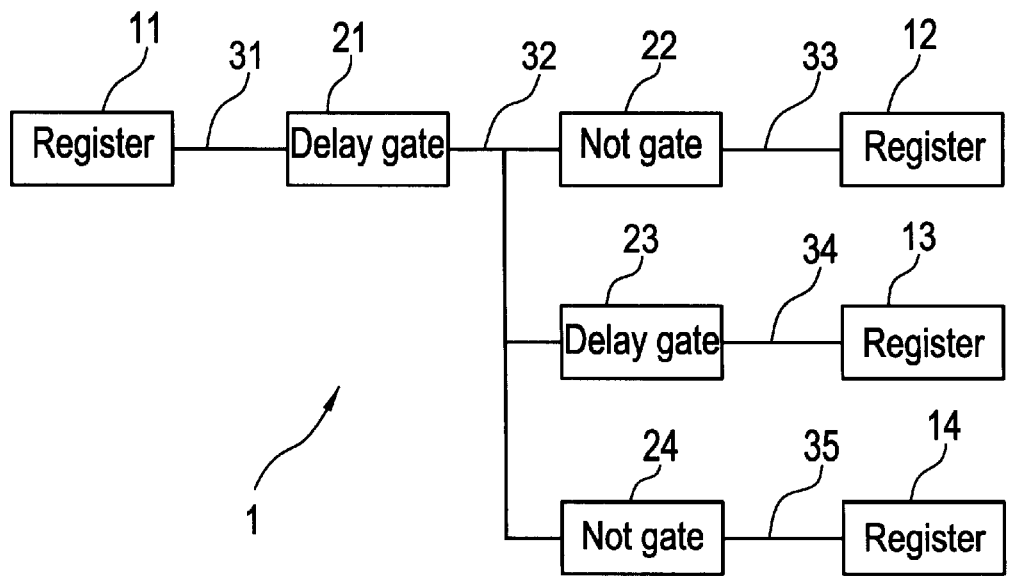
FIG. 1 is a block diagram showing a logic circuit 1 to which the present invention is applied.

Referring to FIG. 1, a logic circuit 1, to which this embodiment applies, comprises a starting-point register and at least one register connected in the vicinity of a latter stage of this register. Logic circuit 1 includes elements and wiring components. More specifically, logic circuit 1 has registers 11, 12, 13, and 14, delay gates 21 and 23, NOT gates 22 and 24, and wiring components 31, 32, 33, 34 and 35. In this embodiment, logic circuit 1 is provided for explanation purposes only and its logic does not perform any particular function. Delay gates 21 and 24 and NOT gates 23 and 24 may be any element that does not have its output determined by a clock signal.

In this embodiment, the starting point of logic circuit 1 is register 11. The output of register 11 is connected to the input of delay gate 21 by wiring component 31. The output of delay gate 21 is connected to the respective inputs of NOT gate 22, delay gate 23, and NOT gate 24 by wiring component 32. The output of NOT gate 22 is connected to the input of the register 12 by wiring component 33. The output of delay gate 23 is connected to the input of register 13 by wiring component 33. The output of NOT gate 24 is connected to the input of register 14 by wiring component 35.

When a plurality of registers are linked in a row in a logic path included in a logic circuit, the logic paths are divided into circuits, such as logic circuit 1 of FIG. 1. That is, they are divided into circuits consisting of a starting-point register and at least one register connected in the vicinity of a latter stage of this register.

Figure 2:
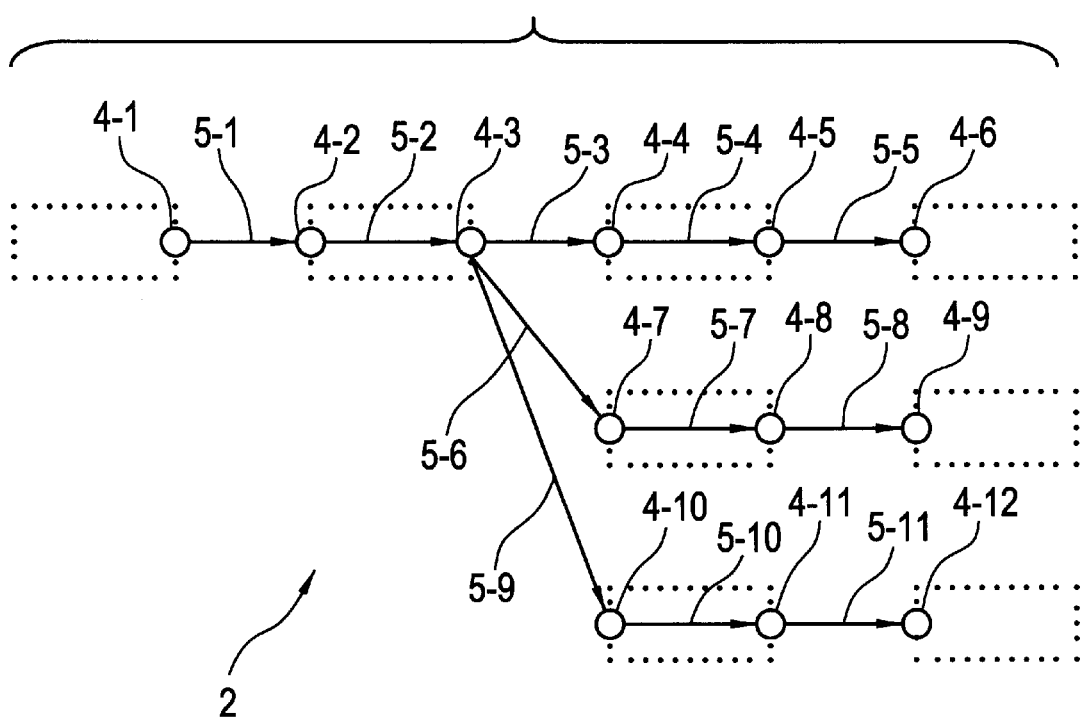
FIG. 2 is a diagram showing graph 2 which corresponds to logic circuit 1 the present invention.

Referring to FIG. 2, logic circuit 1 is expressed as graph 2 for tracing. In graph 2, the pins in logic circuit 1 are expressed as nodes. The flow of a signal through the wiring components and elements is refered to as an arc. Graph 2 has nodes 4-1, 4-2, . . . , 4-11, and 4-12 and arcs 5-1, 5-2, . . . , 5-10, and 5-11.

Figures 3, 4:
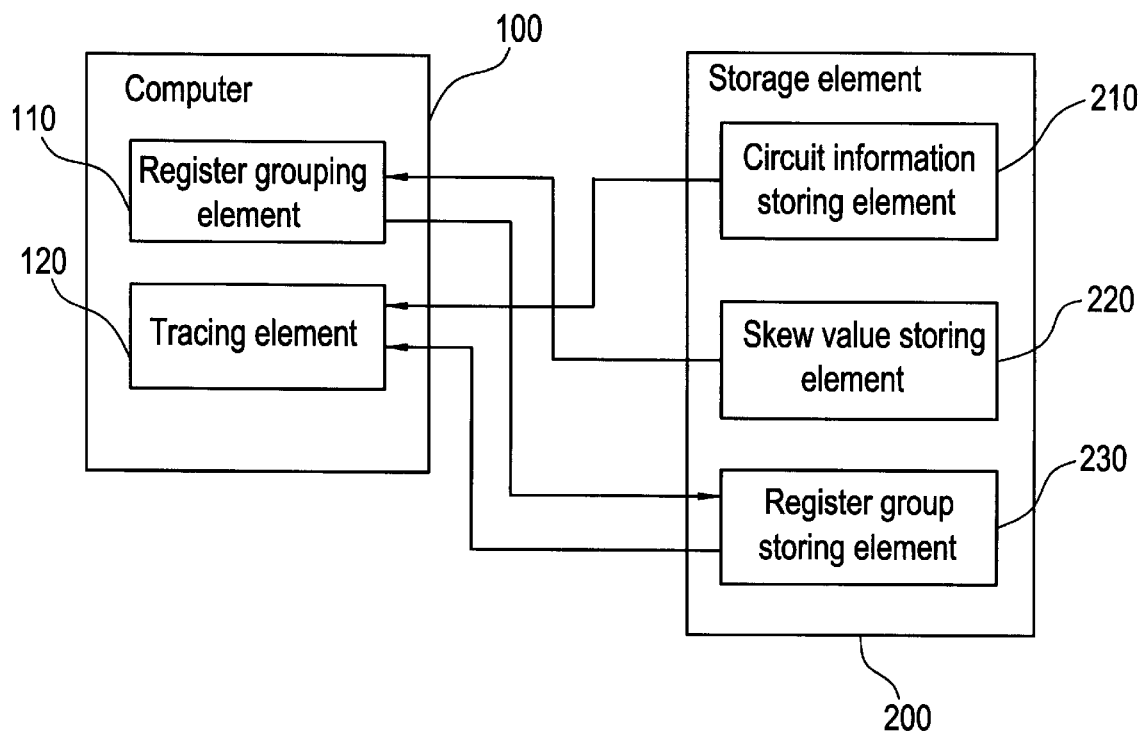
FIG. 3 is a block diagram of the first embodiment of the present invention.
FIG. 4 is a diagram showing node table 211 of the present invention.

Referring to FIG. 3, a first embodiment of the present invention comprises a computer 100, which is operated by a control program, and a storage element 200. Storage element 200 is connected to computer 100 and includes circuit information storing element 210, skew value storing element 220, and register group storing element 230.

Computer 100 includes register grouping element 110 and tracing element 120.

Register grouping element 110 groups a plurality of logic paths included in logic circuit 1, into a plurality of groups based on the clock skew values between registers. More specifically, register grouping element 110 refers to the clock skew values stored in skew value storing element 220, and groups each pair, which consists of a starting-point and an end-point register, into groups based on the clock skew value between the starting-point and the end-point register. Each group has a specific range of clock skew value. In this embodiment, the specific range width of the clock skew values for each group is constant. Grouped pairs of starting-point and end-point of registers are stored in register group storing element 230 by register grouping element 110.

Tracing element 120 traces logic paths grouped by register grouping element 110 in the respective groups. More specifically, tracing element 120 uses the information about logic circuit 1 stored in circuit information storing element 210 and traces each pair of registers belonging to each of the groups stored in register group storing element 230. In the delay time computation at each group, tracing element 120 uses the maximum value of the range of clock skew value which define the group. Tracing element 120 computes a logic path for each group whose delay time is the longest. Then, tracing element 120 determines which of the longest computed logic paths in each group has the maximum delay time. That path is selected as the critical path.

In storage element 200, circuit information storing element 210 stores the information about logic circuit 1. The logic circuit information that is stored in circuit storing element 210 includes element information and wiring component information. Circuit information storing element 210 has a node table 211, which stores element information, and an arc table 212, which stores wiring component information.

Referring to FIG. 4, node table 211 has a field 2111, which stores node identifiers, a field 2112, which stores input direction arcs, a field 2113, which stores output direction arcs, a field 2114, which stores delay times to be added, and a field 2115, which stores pin names. The delay times which are stored in field 2114 are the delay times of each pin.

Referring to FIG. 5, the arc table 212 has a field 2121, which stores arc identifiers, a field 2122, which stores input direction nodes, a field 2123, which stores output direction nodes, a field 2124, which stores arcs of the same input node, a field 2125, which stores arcs of the same output node, a field 2126, which stores delay times, a field 2127, which stores element delay times, a field 2128, which stores element names, and a field 2129, which stores line names.

Skew value storing element 220 has a skew value table 221 which stores clock skew values between the starting point and end point registers.

FIG. 6 shows an example of skew value table 221 which has clock skew values stored for each pair of registers.

Register group storing element 230 has a register group table 231 which stores the grouping results of register grouping element 110.

Referring to FIG. 7, in this embodiment, register group table 231 stores information showing which pair of registers belong to groups G1 or G2.

Next, the operation of this embodiment will be described.

Figure 8:
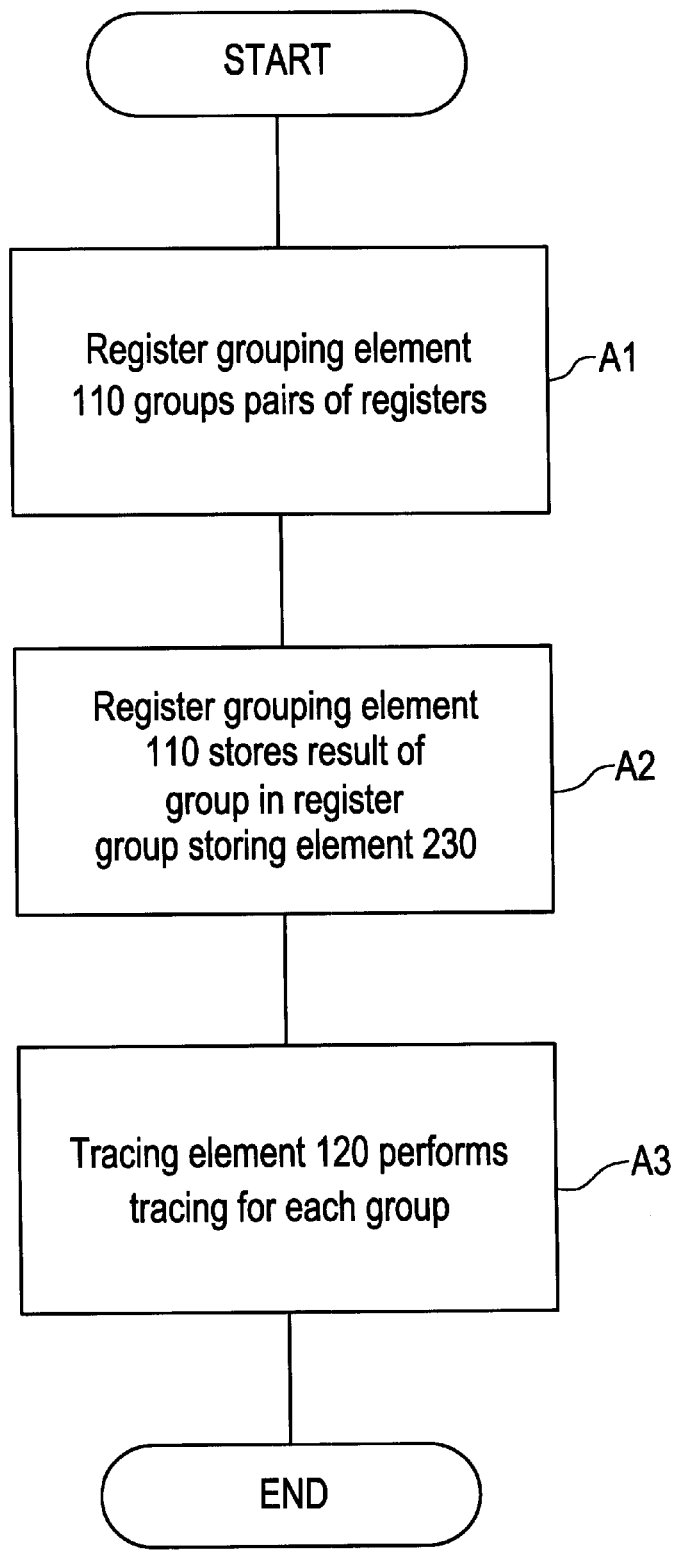
FIG. 8 is a flowchart showing the operation of the first and second embodiments of the present invention.

Referring to FIGS. 3 and 8, in step A1, register grouping element 110, of computer 100, groups a pair of registers constituting logic paths by using clock skew values stored in skew value storing element 220, of storage means 200. Register grouping element 110 stores the grouping result in register group storing element 230, of storage means 200 (step A2).

In step A3, tracing element 120, of computer 100, traces each group based on the contents of register group storing element 230, of storage means 200. A method for tracing is, for example, a DFS.

Next, the operation of tracing element 120 will be described in more detail.

Figure 9:
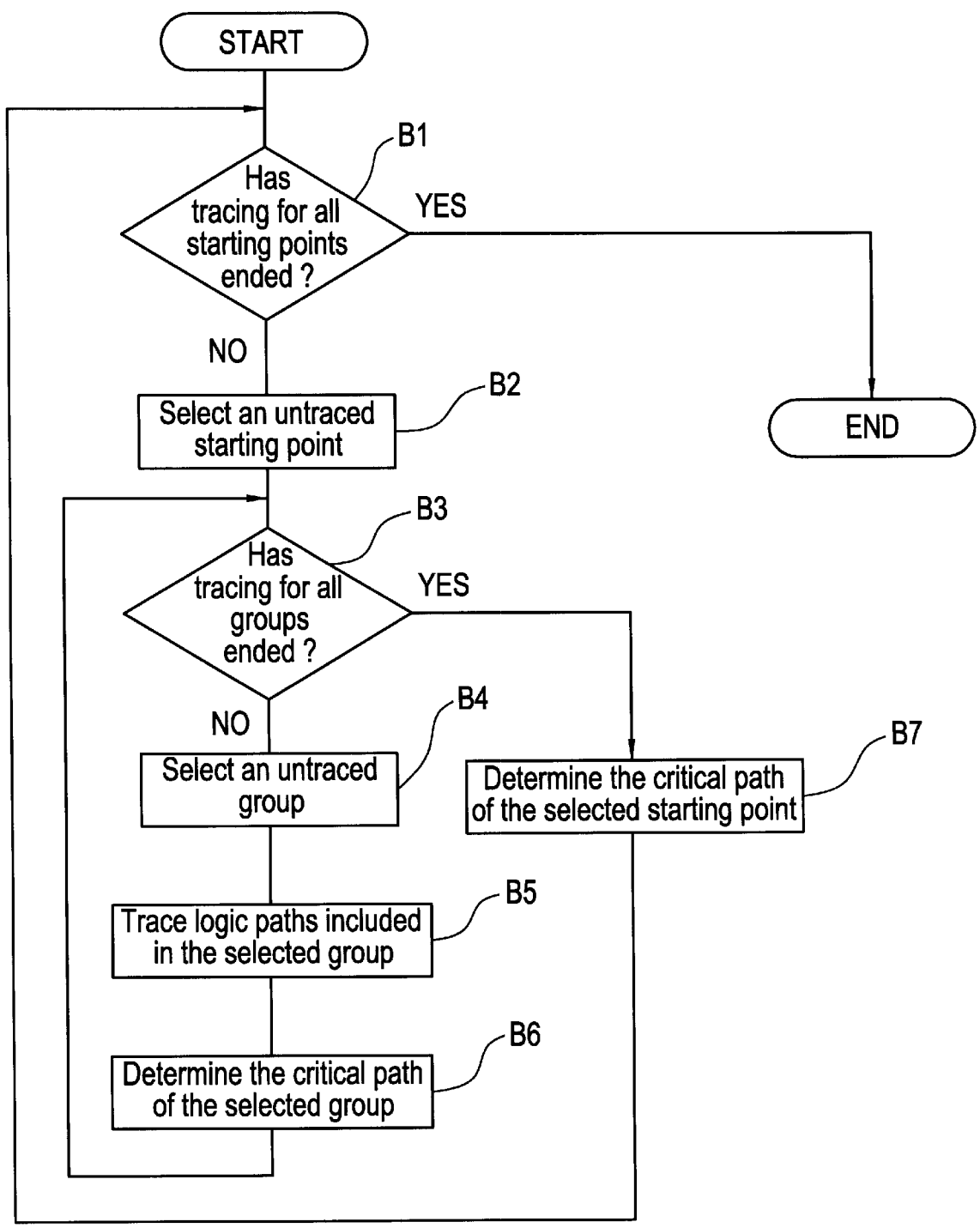
FIG. 9 is a flowchart showing the operation of tracing element 120 of the first and second embodiments of the present invention.

Referring to FIG. 9, in step B1, tracing element 120 determines whether or not tracing has ended for all starting points. If it is determined that tracing has not ended for all starting points, an untraced starting point is selected (step B2).

In step B3, tracing element 120 determines whether or not tracing has ended for all groups consisting of a plurality of logic paths which begin with the selected starting point. If it is determined that tracing has not ended for all groups, an untraced group is selected (step B4). In step B5, tracing element 120 traces paths of pairs of registers included in the selected group. At this time, the clock skew value which is used for computing delay time is the upper limit value of the range of clock skew values which define the selected group. Tracing element 120 then computes the delay times of each of the logic paths in the selected group and determines which logic path has the maximum delay time. The logic path with the maximum delay time is a critical path of this group (step B6). Steps B3 through B6 are repeated until all groups are traced.

In step B3, if it is determined that tracing has ended for all groups, tracing element 120 selects a critical path having the maximum delay time among the critical paths of respective groups whose starting point is the same, and determines the critical path as a critical path which begins with this starting point (step B7). After the critical path has been determined, the tracing process advances to step B1. In step B1, if the tracing element 120 determines that tracing has ended for all starting points, the tracing element 120 ends the tracing process.

Next, the operation of this embodiment will be described in further detail.

Referring to FIG. 7, register grouping element 110 groups pairs of registers with clock skew values in a range of 0 to 2 as group G1, clock skew values in a range of 3 to 5 as group G2, and clock skew values in a range of 6 to 8 as group G3. If a clock skew value is 9 or more, the pairs of registers are grouped in the same manner. In this way, group G1 includes a pair of registers 11 and 12, a pair of registers 11 and 13, and a pair of registers 12 and 14. Group G2 includes a pair of registers 11 and 14, a pair of registers 12 and 14, and a pair of registers 13 and 14. Group G3 and the groups thereafter do not include any logic paths.

Tracing element 120 selects group G1. In group G1, the clock skew value which is used for computing delay time is 2, which is the upper limit value of the range of clock skew values for this group. Tracing element 120 traces and determines that a path from register 11 to register 12 and a path from register 11 to register 13 are included in group G1.

In the path from register 11 to register 12, the delay time is computed as follows:

(delay time of node 4-1+delay time of arc 5-1+delay time of node 4-2+delay time of arc 5-2+delay time of node 4-3+delay time of arc 5-3+delay time of node 4-4 +delay time of arc 5-4+delay time of node 4-5+delay time of arc 5-5+delay time of node 4-6+upper limit skew value of interval 1)=1+1+0+1+0+1+0+2+0+1+1+2=10.

In the path from register 11 to register 13, the delay time is computed as follows: (delay time of node 4-1+delay time of arc 5-1+delay time of node 4-2+delay time of arc 5-2+delay time of node 4-3+delay time of arc 5-6+delay time of node 4-7+delay time of arc 5-7+delay time of node 4-8+delay time of arc 5-8+delay time of node 4-9+upper limit skew value of interval 1)=1+1+0+1+0+1+0+0.5+0+0.5+0.5+2=7.5.

In step B6, in group G1 the path from register 11 to register 12 is determined to be a critical path because the delay time of the path from register 11 to register 12 is longer than that of the path from register 11 to register 13.

Next, tracing element 120 selects group G2. In group G2, the clock skew value which is used for computing delay time is 5, which is the upper value limit. Tracing element 120 traces and determines that group G2 includes a path from register 11 to register 14.

In the path from register 11 to register 14, the delay time is computed as follows:

(delay time of node 4-1+delay time of arc 5-1+delay time o node 4-2+delay time of arc 5-2+delay time of node 4-3+delay time of arc 5-9+delay time of node 4-10+delay time of arc 5-10+delay time of node 4-11+delay time, of arc 5-11+delay time of node 4-12+upper limit skew value of interval 1)=1+1+1+1+0+1+0+0.3+ ++0.3+0.5+5=10.1.

Since group G2 includes only the path from register 11 to register 14, tracing element 120 determines that this path is a critical path.

Logic circuit 1 with register 11 as a starting point includes only two groups, i.e., groups G1 and G2. Therefore, when advancing to step C3, tracing element 120 determines that tracing has ended for all groups. In step B7, tracing element 120 compares the respective critical paths of groups G1 and G2, and determines that the path from register 11 to register 14 is a critical path because it has the maximum delay time. Since the starting point included in logic circuit 1 is only register 11, tracing element 120 ends the tracing process.

This embodiment is provided with register grouping element 110, which groups the pairs of registers into a plurality of groups in accordance with clock skew values, and tracing element 120, which traces each of the groups obtained by the register grouping element 110. Therefore, the true delay time, including clock skew, can be computed and as a result, a true critical path can be determined.

In a conventional tracing method, the delay time of the path from register 11 to register 12 is computed as follows:

1+1+0+1+0+1+0+2+0+1+1=8, and the delay time of the path from register 11 to register 14 is computed as follows:

1+1+0+1+0+1+0+0.3+0+0.3+0.5=5.1.

Using this method, the path from register 11 to register 12 is incorrectly determined as a critical path. On the other hand, the embodiment of the present invention can accurately determine the path leading from register 11 to register 13 as a critical path.

Next, a second embodiment of the present invention will be described below.

A feature of the second embodiment is that tracing element 120 computes not only a critical path having the maximum delay time, but a critical path having the minimum delay time. The remaining constitution is the same as the first embodiment.

Referring to FIG. 9, in step B5, tracing element 120 computes not only delay time by using the upper limit value of the range of clock skew values which define the subject group, but also computes delay time by using the lower limit value of the range which defines the subject group. In step B6, both a logic path having the maximum delay time in a selected group, and a logic path having the minimum delay time are determined as critical paths.

If it is determined that tracing has ended for all groups in step B3, tracing element 120 determines, in step B7, a critical path which has the maximum delay time among the critical paths of a plurality of groups as a critical path having the maximum delay time in the selected starting point. Tracing element 120 also determines, in step B7, a critical path which has the minimum delay time among the critical paths of a plurality of groups as a critical path having the minimum delay time in the selected starting point.

In this embodiment, tracing element 120 also computes delay time by using the lower limit values which define the range of a group when tracing element 120 performs tracing. Therefore, tracing element 120 can compute a critical path having the maximum delay time and a critical path having the minimum delay time at the same time.

Next, a third embodiment of the present invention will he described below.

Figure 10:
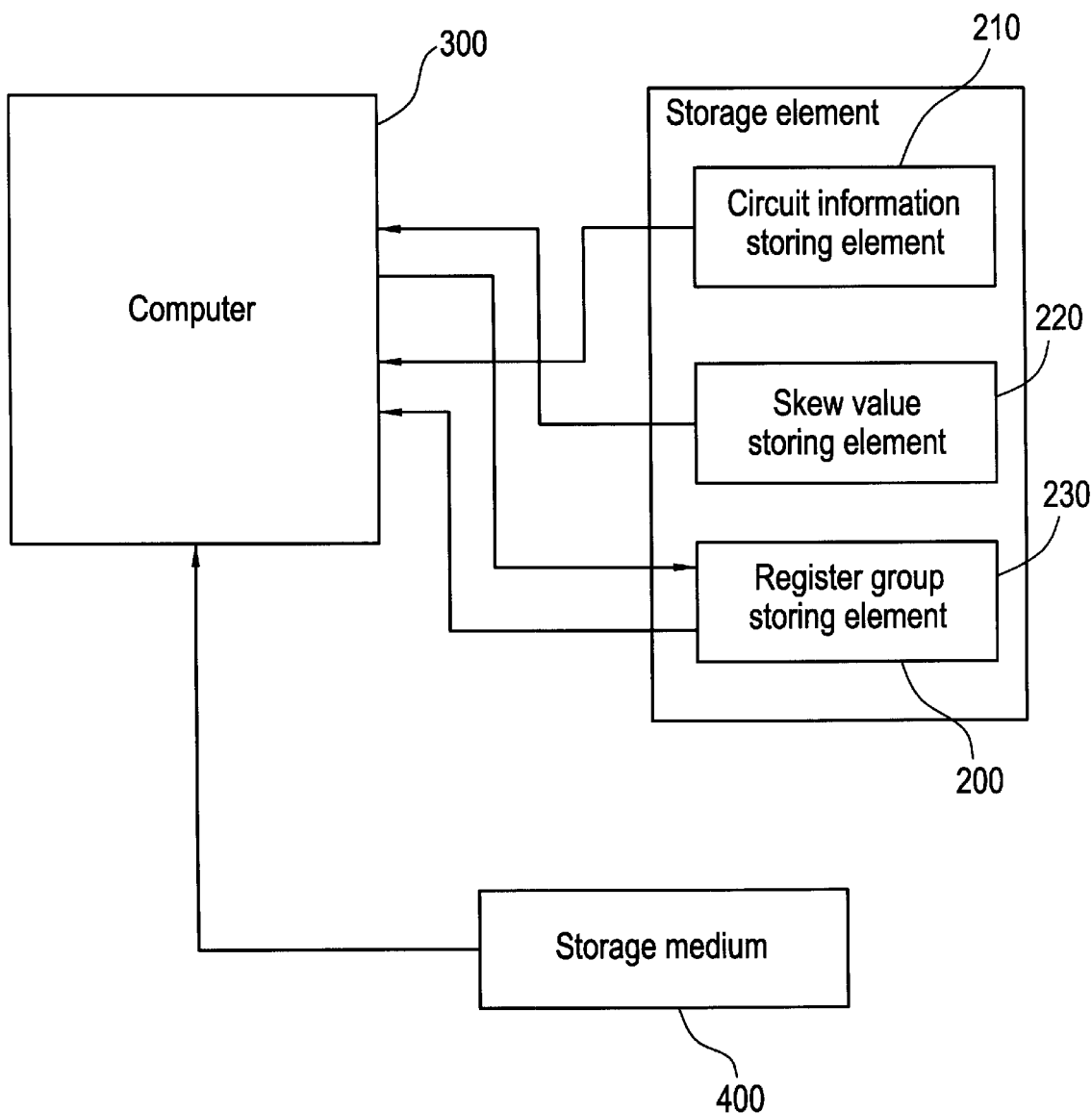
FIG. 10 is a block diagram of a third embodiment of the present invention.

Referring to FIG. 10, the third embodiment of the present invention has a computer 300, a storage element 200, and a storage medium 400 which stores a delay computation program. Storage medium 400 may be a magnetic disk, semiconductor memory, or the other storage medium.

The delay computation program is read from the storage medium 400 to computer 300 and controls the operation of computer 300. Under the control of the delay computation program, computer 300 executes the following process, i.e., the same process performed by computer 100 in the first embodiment.

First, computer 300 refers to the clock skew values stored in skew value storing element 220 of storage element 200, and groups each plurality of pairs consisting of two registers for each predetermined range corresponding to the clock skew values between registers. Next, computer 300 stores the grouped result in register group storing element 230 of storage element 200. Then, computer 300 traces each pair of registers belonging to a plurality of groups, stored in register group storing element 230, by using the information about logic circuit 1 stored in circuit information storing element 210 of storage element 200. In this tracing process, a logic path with the maximum delay time is computed for each group, and among the logic paths of all groups having the maximum delay time, the logic path with the greatest delay time is determined as a critical path.

Although this embodiment demonstrates the situation where registers are applied as an element whose delay time varies under the influence of clock skew, any element can be applied as long as its output is determined by the input of a clock signal and another signal.

In this embodiment, while it has been assumed that the range of clock skew values for grouping pairs of registers has a constant width, the range of width of clock skew values can be changed based on computation requirements. In a region where a precise delay time is desired, the range of clock skew values is set to a small width. For example, where a critical path with the maximum delay time is computed, it is necessary that the width becomes smaller as the clock skew value increases. Conversely, where a critical path with the minimum delay time is computed, it is necessary that the width becomes smaller as the clock skew value decreases.

While this invention has been described in conjunction with the preferred embodiments described above, it will now be possible for those skilled in the art to put this invention into practice using various other manners.

What is claimed is:

1. An apparatus for computing delay times of logic paths included in a logic circuit which has a plurality of elements whose output is determined by input of a clock signal and at least one signal which is not said clock signal, said apparatus comprising:

a first element which stores information about said logic circuit;

a second element which groups pairs of two of said elements into groups based on a clock skew value of said pairs of said elements, wherein each group has a specific range of clock skew values; and a third element which computes a delay time for each of said pairs grouped by said second element by using a predetermined clock skew value which is within said range used in said second element and said information about said logic circuit stored in said first element.

2. The apparatus as claimed in claim 1, further comprising:

a fourth element which stores clock skew values between each of said two elements of each of said pairs, respectively;

wherein said second element groups by using a clock skew value stored in said fourth element as said clock skew value.

3. The apparatus as claimed in claim 1, wherein one of said pairs has two elements which are adjacent to each other and form a single logic path.

4. The apparatus as claimed in claim 1, wherein said third element uses an upper limit value of said range as said predetermined value.

5. The apparatus as claimed in claim 1, wherein said third element uses a lower limit value of said range as said predetermined value.

6. The apparatus as claimed in claim 1, wherein a width of said range is constant.

7. The apparatus as claimed in claim 1, wherein a width of said range varies.

8. The apparatus as claimed in claim 1, further comprising:

a fifth element which determines first critical paths in each of said groups which are related to a plurality of logic paths beginning with a single starting point by using said delay time computed by said third element; and a sixth element which determines a second critical path which has a maximum delay time among said first critical paths as a critical path of said logic paths beginning with said starting point.

9. The apparatus as claimed in claim 1, further comprising:

a seventh element which determines first critical pates in each of said groups which are related to a plurality of logic paths beginning with a single starting point by using said delay time computed by said third element; and an eighth element which determines a second critical path which has a minimum delay time among said first critical paths as a critical path of said logic paths beginning with said starting point.

10. The apparatus as claimed in claim 1, further comprising:

a ninth element which divides said logic circuit into circuits which consist of a starting-point register and at least one of said elements connected in vicinity to said latter stage of said starting-point register, when a logic circuit includes logic paths in which at least three of said elements are linked in a row.

11. An apparatus for computing delay times of logic path included in a logic circuit which has a plurality of elements whose output is determined by input of a clock signal and at least one signal which is not said clock signal, said apparatus comprising:

first storage means for storing information about said logic circuit;

means for grouping pairs of two of said elements into groups based on a clock skew value of said pairs of said elements, wherein each group has a specific range of clock skew values; and means for computing a delay time for each of said pairs grouped by said grouping means by using a predetermined clock skew value which is within said range used in said grouping means and said information about said logic circuit stored in said first storage means.

12. The apparatus as claimed in claim 11, further comprising:

the second storage means for storing clock skew values between each of said two elements of each of said pairs, respectively;

wherein said grouping means groups by using a clock skew value stored in said second storage means as said clock skew value.

13. The apparatus as claimed in claim 11, wherein one of said pairs has two elements which are adjacent to each other and form a single logic path.

14. The apparatus as claimed in claim 11, wherein said computing means uses an upper limit value of said range as said predetermined value.

15. The apparatus as claimed in claim 11, wherein said computing means uses a lower limit value of said range as said predetermined value.

16. The apparatus as claimed in claim 11, wherein a width of said range is constant.

17. The apparatus as claimed in claim 11, wherein a width of said range varies.

18. The apparatus as claimed in claim 11, further comprising:

first means for determining first critical paths in each of said groups which are related to a plurality of logic paths beginning with a single starting point by using said delay time computed by said computing means; and second means for determining a second critical path which has a maximum delay time among said first critical paths as a critical path of said logic paths beginning with said starting point.

19. The apparatus as claimed in claim 11, further comprising:

first means for determining first critical paths in each of said groups which are related to a plurality of logic paths beginning with a single starting point by using said delay time computed by said computing means; and second means for determining a second critical path which has a minimum delay time among said first critical paths as a critical path of said logic paths beginning with said starting point.

20. The apparatus as claimed in claim 11, further comprising means for dividing said logic circuit into circuits which consist of a starting-point register and at least one of said elements connected in vicinity to said latter stage of said starting-point register, when a logic circuit includes logic paths in which at least three of said elements are linked in a row.

21. A method for computing delay times of logic paths included in a logic circuit which has a plurality of elements whose output is determined by input of a clock signal and at least one signal which is not said clock signal, said method comprising:

storing information about said logic circuit in a first storing element;

grouping pairs of two of said elements into groups based on a clock skew value of said pairs of said elements, wherein each group has a specific range of clock skew values; and computing a delay time for each of said pairs grouped during said grouping step by using a predetermined clock skew value which is within said range used during said grouping step and said information of said logic circuit stored in said first storage element.

22. The method as claimed in claim 21, further comprising:

storing clock skew values between each of said two elements of each of said pairs, respectively, to a second storing element; wherein said grouping step includes grouping said pairs by using said clock skew value stored in said second storage element as said in clock skew value.

23. The method as claimed in claim 21, further comprising determining first critical paths in each of said groups which are related to a plurality of logic paths beginning with a single starting point by using said delay time computed during said computing step; and determining a second critical path which has a maximum delay time among said first critical paths as a critical path of said logic paths beginning with said starting point.

24. The method as claimed in claim 21, further comprising:

determining first critical paths in each of said groups which are related to a plurality of logic paths beginning with a single starting point by using said delay time computed during said computing step, and determining a second critical path which has a minimum delay time among said first critical paths as a critical path of said logic paths beginning with said starting point.

25. The method as claimed in claim 21, further comprising:

dividing said logic circuit into circuits which consist of a starting-point register and at least one of said elements connected in vicinity to said latter stage of said starting-point register, when a logic circuit includes logic paths in which at least three of said elements are linked in a row.

26. A computer-usable storage medium having a computer program embodied thereon for causing a computer to determine delay times of logic paths by performing the following steps when such program is executed on the computer:

storing information of said logic circuit in a first storing element;

grouping pairs of two of said elements into groups based on a clock skew value of said pairs of said elements, wherein each group has a specific range of clock skew values; and computing a delay time for each of said pairs grouped during said grouping step by using a predetermined clock skew value which is within said range used during said grouping step and said information about said logic circuit stored in said first storage element.

27. The computer-usable storage medium having a computer program as claimed in claim 26, further including the following steps when such program is executed on the computer:

storing clock skew values between each of said two elements of each of said pairs, respectively, to a second storing element; wherein said grouping step includes grouping said pairs by using said clock skew value stored in said second storage element as said clock skew value.

28. The computer-usable storage medium having a computer program as claimed in claim 26, further including the following steps when such program is executed on the computer:

determining first critical paths in each of said groups which are related to a plurality of logic paths beginning with a single starting point by using said delay time computed during said computing step; and determining a second critical path which has a maximum delay time among said first critical paths as a critical path of said logic paths beginning with said starting point.

29. The computer-usable storage medium having a computer program as claimed in claim 26, further including the following steps when such program is executed on the computer:

determining first critical paths in each of said groups which are related to a plurality of logic paths beginning with a single starting point by using said delay time computed during said computing step; and determining a second critical path which has a minimum delay time among said first critical paths as a critical path of said logic paths beginning with said starting point.

30. The computer-usable storage medium having a computer program as claimed in claim 26, further including the following steps when such program is executed on the computer:

dividing said logic circuit into circuits which consist of a starting-point register and at least one of said elements connected in vicinity to said latter stage of said starting-point register, when a logic circuit includes logic paths in which at least three of said elements are linked in a row.

* * * * *

UNITED STATES PATENT AND TRADEMARK OFFICE
CERTIFICATE OF CORRECTION

PATENT NO.   : 6,341,363 B1
DATED         : January 22, 2002
INVENTOR(S) : Takumi Hasegawa It is certified that error appears in the above-identified patent and that said Letters Patent is hereby corrected as shown below:

Column 5,
Line 43, delete "6 to 3" and insert therefor -- 6 to 8 --.

Column 6,
Line 20, delete "o node" and insert therefor -- of node --.
Line 24, delete "1)=1+1+1+1+0+1+0+0.3+ ++0.3+0.5+5=10.1" and insert therefor
-- 1)=1+1+0+1+0+1+0+0.3+0+0.3+0.5+5=10.1 --.

Column 8,
Line 52, delete "pates" and insert therefor -- paths --.

Signed and Sealed this

Tenth Day of September, 2002

*Attest:*

JAMES E. ROGAN
*Attesting Officer*     *Director of the United States Patent and Trademark Office*